US011245225B2

(12) United States Patent
Troeger et al.

(10) Patent No.: US 11,245,225 B2
(45) Date of Patent: Feb. 8, 2022

(54) LOCKING DEVICE FOR PLUG CONNECTORS

(71) Applicant: HARTING ELECTRIC GMBH & CO. KG, Espelkamp (DE)

(72) Inventors: Lutz Troeger, Osnabrueck (DE); Till Riechmann, Stemwede (DE)

(73) Assignee: HARTING ELECTRIC GMBH & CO. KG

( * ) Notice: Subject to any disclaimer, the term of this patent is extended or adjusted under 35 U.S.C. 154(b) by 734 days.

(21) Appl. No.: 16/089,308

(22) PCT Filed: Mar. 16, 2017

(86) PCT No.: PCT/DE2017/100210
§ 371 (c)(1),
(2) Date: Sep. 27, 2018

(87) PCT Pub. No.: WO2017/167327
PCT Pub. Date: Oct. 5, 2017

(65) Prior Publication Data

US 2019/0115693 A1 Apr. 18, 2019

(30) Foreign Application Priority Data

Apr. 1, 2016 (DE) ..................... 10 2016 105 975.7

(51) Int. Cl.
*H05K 5/00* (2006.01)
*H01R 13/627* (2006.01)
*H01R 13/703* (2006.01)

(52) U.S. Cl.
CPC ..... *H01R 13/6276* (2013.01); *H01R 13/7036* (2013.01)

(58) Field of Classification Search
CPC ........ H02G 3/20; H01R 4/132; H01R 4/4818; H01R 13/6275; H01R 13/447
(Continued)

(56) References Cited

U.S. PATENT DOCUMENTS

| | | | | |
|---|---|---|---|---|
| 5,002,500 | A | 3/1991 | Zuccaro et al. | 439/348 |
| 5,129,836 | A | 7/1992 | Ursich | 439/346 |

(Continued)

FOREIGN PATENT DOCUMENTS

| | | | |
|---|---|---|---|
| CA | 1482713 | 3/2004 | B61G 5/10 |
| CN | 102315545 | 1/2012 | H01R 13/02 |

(Continued)

OTHER PUBLICATIONS

German Search Report (w/machine translation) issued in application No. 10 2016 105 975.7, dated Jun. 28, 2018 (14 pgs).

(Continued)

*Primary Examiner* — Phuong Chi Thi Nguyen
(74) *Attorney, Agent, or Firm* — Hayes Soloway P.C.

(57) ABSTRACT

A locking arrangement for plug connectors, comprising a first locking device and a second locking device. The two locking devices can be plugged together and engaged with one another. At least one blocking element is provided for engaging the first locking device with the second locking device. The blocking element is suitable for mechanical engaging and can be actuated and released via an actuator. In addition, another actuator is arranged in the first locking device or in the second locking device to protect against failure of the locking arrangement. The engaging of the two locking devices can be released by the actuator, even when the actuator fails. The first locking device and the second locking device are provided for use in a plug and a corresponding counter plug.

19 Claims, 3 Drawing Sheets

(58) Field of Classification Search
USPC ..................... 439/537, 79; 361/759; 438/188
See application file for complete search history.

(56) References Cited

U.S. PATENT DOCUMENTS

| | | | | |
|---|---|---|---|---|
| 6,225,153 | B1 * | 5/2001 | Neblett | B60L 53/16 438/188 |
| 6,498,730 | B2 * | 12/2002 | Centola | H05K 7/1407 361/756 |
| 6,935,881 | B2 | 8/2005 | Kainz et al. | 439/310 |
| 7,462,066 | B2 * | 12/2008 | Kohen | F21V 21/03 439/537 |
| 8,444,190 | B2 | 5/2013 | Schmidt et al. | 292/202 |
| 8,636,527 | B2 | 1/2014 | Hengel et al. | 439/141 |
| 8,979,568 | B2 | 3/2015 | Herbrechtsmeier et al. | H01R 13/62966 |
| 2002/0106927 | A1 | 8/2002 | Bosy et al. | 439/345 |
| 2005/0148241 | A1 | 7/2005 | Kohen | 439/620 |
| 2012/0094512 | A1 * | 4/2012 | Northey | G09B 19/00 439/116 |

FOREIGN PATENT DOCUMENTS

| | | | |
|---|---|---|---|
| CN | 203013995 | 6/2013 | H01R 13/05 |
| CN | 203445371 | 2/2014 | H01R 13/46 |
| CN | 104393822 | 3/2015 | H02S 20/00 |
| CN | 204391444 | 6/2015 | H01R 13/02 |
| CN | 104821445 | 8/2015 | H01R 12/70 |
| CN | 104868310 | 8/2015 | H01R 13/502 |
| CN | 104901075 | 9/2015 | H01R 13/629 |
| CN | 104934781 | 9/2015 | H01R 13/629 |
| CN | 105186167 | 12/2015 | H01R 12/77 |
| DE | 202010002396 | 5/2010 | H01R 13/629 |
| DE | 102008060561 | 7/2010 | H05K 5/02 |
| DE | 102009039652 | 3/2011 | H01R 13/62 |
| DE | 102010038568 | 2/2012 | B60L 11/18 |
| DE | 102011004648 | 8/2012 | H01R 13/71 |
| FR | 2232101 | 12/1974 | H01R 13/703 |

OTHER PUBLICATIONS

International Search Report and Written Opinion (w/translation) issued in application No. PCT/DE2017/100210, dated May 26, 2017 (22 pgs).

Chinese Office Action (w/translation) issued in application No. 201780020368.6, dated Dec. 6, 2019 (15 pgs).

Chinese Office Action (w/translation) issued in application No. 201780020368.6, dated May 23, 2019 (19 pgs).

International Preliminary Report on Patentability, dated Oct. 2, 2018 issued in application No. PCT/DE2017/100210 (11 pgs).

* cited by examiner

LOCKING DEVICE FOR PLUG CONNECTORS

BACKGROUND OF THE INVENTION

The invention is based on a locking device for plug connectors, having a first locking means and a second locking means, wherein the first locking means has at least one blocking element, wherein the first locking means and the second locking means are capable of being locked to one another by the blocking element.

Such locking devices are required for locking plug connectors mechanically to one another, said plug connectors consisting of a male connector and a female connector. In order to ensure a secure connection between the male connector and the female connector, mechanical locking is thus required in order to protect the plug connector from being opened in an undesired manner.

In the industrial sector, locking devices are usually fitted to plug connectors on the outside in order for it to be possible for them to be opened or closed by a fitter or technician. Depending on the nature and design of the plug connector, locking devices are also known which are inside the plug connector. This is primarily expedient when the mechanical lock needs to be protected from dirt, grime and moisture. However, even in the case of internal locking devices, it is always necessary for there to be an activator on the outside of the plug connector, by means of which activator the lock can be opened or closed.

BRIEF DESCRIPTION OF THE PRIOR ART

DE 10 2008 060 561 B4 discloses a plug connector with an internal lock. In this case, a spring steel sheet is arranged on the inside of a male connector, said spring steel sheet being provided for the purpose of latching with a latching tab arranged on the inside of a female connector. A push-button is arranged on the outside of the male connector, protrudes through the wall of the male connector and thus acts on the spring steel sheet in such a way that the latching with respect to the latching tab can be released.

DE 20 2010 002 396 U1 discloses a plug connector having an outer lock. Two locking clips are fitted on a first male connector, it being possible for said locking clips to be latched in rotatably movable fashion via pins on a female connector. By virtue of the latching of the locking clips via the pins of the female connector, the male connector is held mechanically on the female connector.

Internal locking devices which are based on the use of automatically moved slides or locking bars are also known from the prior art. Such locking devices, preferably when used in the electric mobility sector for the protection from theft of charging cables on automobile charging stations, have a very complex configuration, however, owing to their use in an automobile or an associated charging station. The mechanically complex devices are usually structurally very solid and are therefore designed so as to be space-intensive in order to provide protection against vandalism and to be able to absorb high withdrawal forces.

SUMMARY OF THE INVENTION

Therefore, the invention is based on the object of proposing a locking device for plug connectors in the industrial sector. In this case, the locking device is intended to be so small that it can be used in conventional industrial plug connectors and is therefore protected against impurities outside the plug connector.

In addition, the locking device is intended to be capable of being operated on low currents. The lock between the male connector and the female connector is also intended to be maintained in the event of a power failure. However, the locking device is at the same time intended to still be releasable even when there is no power or in the event of a failure of individual components.

The invention is based on a locking device for plug connectors, preferably for plug connectors in the industrial sector. The locking device is designed for mechanically connecting and locking a male connector to a corresponding female connector. In this case, the locking device has a first locking means and a second locking means. The first locking means and the second locking means are intended for mutual locking. For this purpose, at least one blocking element is provided on the first locking means. It is possible for the first locking means to be locked to the second locking means by means of the blocking element. Preferably, the first locking means and the second locking means are designed in such a way that they can be plugged to one another.

The blocking element is configured in such a way that, when the male connector is plugged to the female connector, the first locking means and the second locking means are locked to one another by the blocking element, and separation of the two locking elements is mechanically suppressed. In accordance with the invention, the first locking means has an actuator. The actuator is arranged in the first locking means and can act on the blocking element. Thus, the actuator can bring the blocking element into a blocking position, in which the blocking element blocks the locking means connected to one another, and into an open position, in which the two locking means can be connected to one another or separated from one another.

Depending on the embodiment and application area of the locking device and the plug connector, various embodiments of the actuator are possible. For example, the actuator may be an electrically operated actuator, such as an electric motor or a linear solenoid, for example. However, the use of pneumatic actuators such as, for example, a cylinder may also be expedient.

Expediently, the first locking means and the second locking means have a first plug part and a second plug part, respectively. The plug parts are formed on the plugging side on the locking means, with the result that they are plugged one inside the other when the male connector and the female connector are connected to one another. Preferably, the first plug part is in this case in the form of a pin, i.e. in the form of a cylinder, and the second plug part is in the form of a socket, i.e. in the form of a hollow cylinder. Thus, the first plug part can be inserted into the second plug part and received therein in a form-fitting manner. An embodiment of the first plug part in the form of a socket and of the second plug part in the form of a pin is also conceivable and expedient in accordance with the invention.

Further embodiments of the first plug part and the second plug part such as, for example, square, rectangular or polygonal are conceivable in the same way as the cylindrical embodiment of the plug parts. Preferably, the first plug part and the second plug part are in this case always pluggable one inside the other in a form-fitting manner. However, this does not necessarily need to be the case. Plug parts which are pluggable one inside the other in a non-form-fitting manner are also advantageous. Thus, for example, the socket plug part may be designed to be larger than the pin plug part in order to enable improved plugging one inside the other. It is only necessary for the locking of the first plug part to the second plug part by virtue of the blocking element to be enabled in the embodiments in accordance with the invention.

In accordance with the invention, the blocking element is provided or fitted on the first plug part. In the case of plug parts which are plugged one inside the other, the blocking element can engage in the second plug part in such a way that separation of the plug parts is no longer possible. For the embodiments of the blocking element, in this case all of the possibilities for blocking elements known from the prior art may be used. Latching tabs or latching hooks, blocking pins or blocking bolts and any others from the known blocking elements which can be scaled to the size of an industrial plug connector are expedient here.

The use of so-called quick release ball lock pins has proven to be particularly advantageous for use in plug connectors in the industrial sector. In this case, the blocking element itself is formed by at least one ball. Expediently, two, three or more balls are suitable for a secure application. In this case, the ball is arranged in the first plug part of the locking device, said plug part being in the form of a pin plug part. A region of the ball in this case protrudes beyond the outer lateral surface of the pin plug part. The remainder of the ball is received in the first plug part.

A mandrel is provided in the pin plug part and is slidable along the pin plug part. The mandrel has narrow and broad regions which, depending on the position of the mandrel in the first plug part, allow the ball to penetrate to a greater or lesser extent into the first plug part. Thus, the ball can penetrate so far into the pin plug part in the narrow region of the mandrel that it is completely received in the pin plug part. Thus, the ball does not have any blocking effect and the pin plug part can be inserted into the second plug part, which is embodied as a socket plug part.

If the mandrel is moved, the broad region pushes the ball out of the pin plug part such that said ball is located, in regions, outside the pin plug part. In this position, the ball deploys its effect as blocking element. In the second locking means, the ball grips behind the socket plug part, with the result that the pin plug part can no longer be removed.

Depending on the embodiment, the second plug part can be designed differently such that the ball can engage as blocking element. In addition to a short design, behind which the ball can exert its blocking effect, a slot running circumferentially in the second plug part or a notch is also conceivable. When the first plug part has been inserted, the ball can move into the slot or notch.

In the case of a locking device having quick release lock pins, an embodiment with two or three balls is particularly expedient. A development of this embodiment provides that the first locking means and the second locking means are equipped with corresponding contact elements. The contact elements are fitted to the locking means in such a way that they likewise make contact with one another when the first and second plug parts are completely plugged one inside the other. The contact elements can be in the form of electrical, pneumatic or combined electrical and pneumatic contacts. Depending on the field of use of the plug connector and embodiment of the actuator, different variants may be expedient here.

A further embodiment of the present invention envisages using a limit switch in the locking device. The limit switch is in this case expediently arranged in the first locking means or second locking means. The second locking means or the first locking means, respectively, act as activators for the limit switch, correspondingly. Thus, the limit switch is activated when the first and second locking means are completely connected to one another.

A specific embodiment envisages that the limit switch is arranged in the second locking means and is activated by the first plug part of the first locking means. It is thus possible to ensure that the first plug part, which is in the form of a pin, is located within the second plug part, which is embodied as a socket, and thus secure mechanical locking by virtue of the blocking element is ensured. The limit switch is connected to the actuator in the first locking means via the contact elements for this purpose. Only when the limit switch has been activated can the actuator activate the blocking elements and thus produce locking between the first locking means and the second locking means.

In order to ensure the fail safety of the locking device, a further preferred embodiment envisages that the locking device has an activator, which acts on the blocking element. In this case, the activator, in contrast to the actuator, is intended and suitable for manual operation. In this case, the activator can act directly on the blocking element or indirectly.

One embodiment, for example, envisages that the activator is in the form of a screw bolt. The screw bolt is in this case rotatable and slidable along the plugging direction. On the plugging side, the actuator is fitted to the screw bolt. By virtue of the screw bolt being unscrewed counter to the plugging direction, the actuator can thus be moved and the blocking element thereby released.

A specific embodiment envisages that the mandrel of the quick release ball lock pin is formed in two parts. In this case, the tip of the mandrel is fitted to the main part of the mandrel in screwable fashion. The front part, the tip of the mandrel, acts as activator and can be unscrewed from the plugging direction, with the result that the ball releases the lock.

Expediently, the locking device having the activator additionally has an opening, through which the activator can be activated from outside. Thus, in the case of an activator in the first locking means, the first locking means is equipped with an opening which enables access to the activator. In the case of an activator in the second locking means, said locking means is correspondingly equipped with an opening. In addition to the embodiment as a screw bolt or a two-part mandrel, the activator can also have the form of a pin, a spring, a latching tab, a split pin or other technical devices which are suitable for releasing the lock by virtue of the blocking element.

In a particularly preferred embodiment, the first locking means and the second locking means are plug connector modules, which are intended to be received in a modular plug connector. In the case of such modular plug connectors, various plug connector modules can be combined with one another. Thus, the proposed locking device can also be used in a particularly advantageous manner as a plug connector module in such modular plug connectors. By virtue of receiving means which are provided on the first locking means and the second locking means, said first and second locking means can be received, for example, in a holding frame, which can in turn be inserted into a plug connector housing. Thus, a particularly flexible and variable use of the proposed locking device in the field of industrial plug connectors is possible.

BRIEF DESCRIPTION OF THE DRAWINGS

One exemplary embodiment of the invention is illustrated in the drawings and will be explained in more detail below. In the drawings.

Some of the figures include simplified, schematic illustrations. In part, identical reference symbols are used for the same, but possibly non-identical elements. Different views of the same elements could be scaled differently.

DETAILED DESCRIPTION OF THE INVENTION

Figure 1:
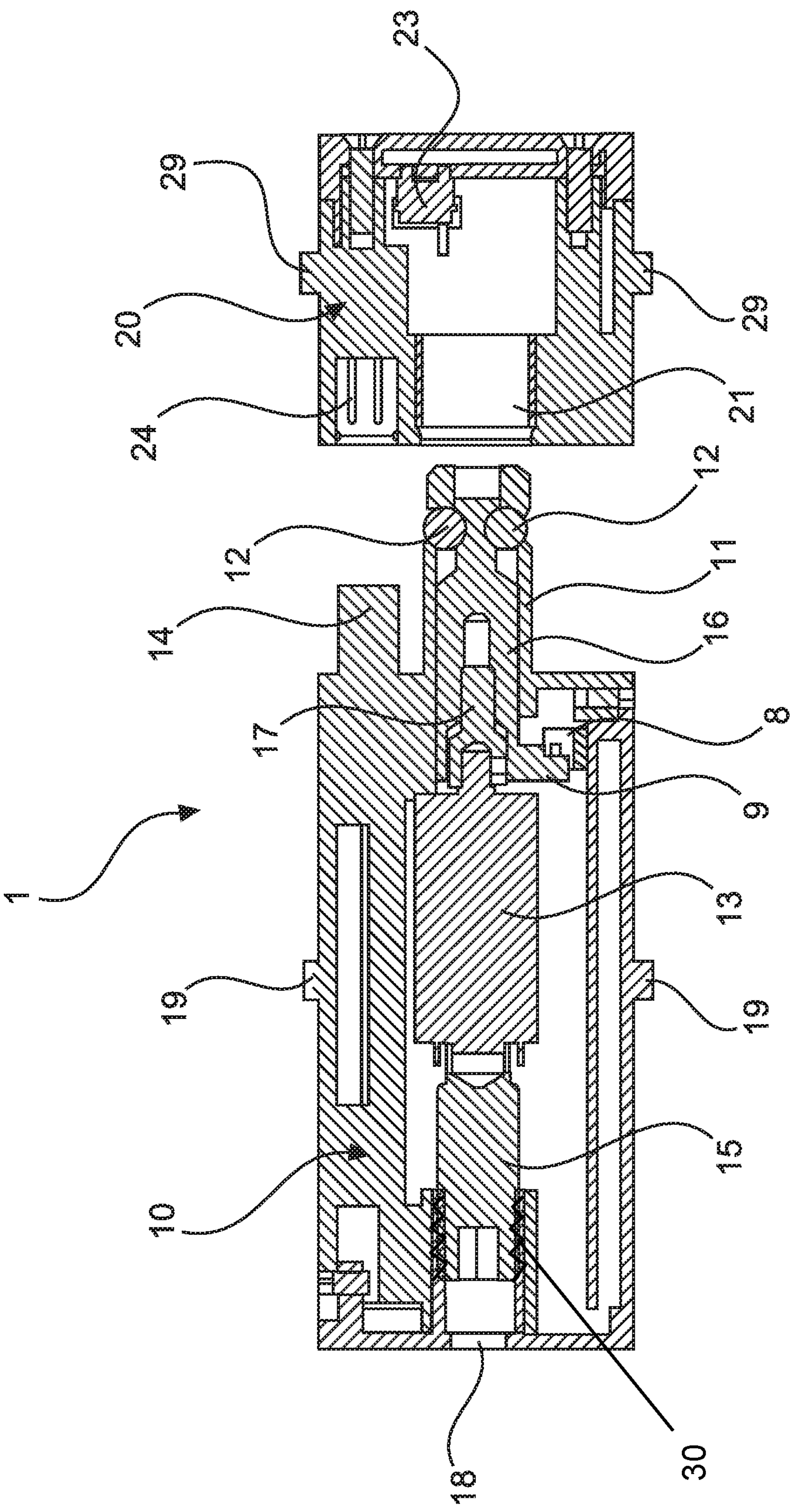
FIG. 1 shows a sectional illustration of a first embodiment of a locking device when separated.

FIG. 1 shows a sectional illustration of a locking device 1 in accordance with the present invention. The locking device 1 is formed from a first locking means 10 and a second locking means 20. The first locking means 10 and the second locking means 20 are in the form of plug connector modules, which are intended to be received in a holding frame for modular plug connectors. Two receiving means 19 are formed integrally on the first locking means 10 for the purpose of receiving said locking means in a holding frame, with it being possible for the first locking means 10 to be held in receptacles of a holding frame in a form-fitting manner by means of said receiving means. Correspondingly, receiving means 29 are formed integrally on the second locking means 20.

The locking means 10, 20 are preferably produced from an electrically insulating plastic. Thus, electrical components can be received directly in the housings of the first locking means 10 and the second locking means 20. A first plug part 11 is formed integrally on the first locking means 10 on the plugging side. The first plug part 11 is embodied as a pin plug part and, together with a mandrel 16 and two balls which act as blocking elements 12, forms a so-called quick release ball lock pin. The balls are received in the front part of the first plug part 11. A securing sleeve is arranged around the first plug part 11 and holds the balls in the first plug part 11 and prevents them from falling out. The securing sleeve, however, is configured in such a way that the balls can protrude out of the first plug part 11 in regions.

The mandrel 16 guided in the first plug part 11 has a narrow region and a broader region. In FIG. 1, the mandrel 16 is arranged in the first plug part 11 in such a way that the balls lie in the narrower region of the mandrel 16 and completely penetrate the first plug part 11.

A sloping surface is provided between the narrow region and the broad region of the mandrel 16. By virtue of a movement of the mandrel 16 in the plugging direction, the balls are pushed radially outwards over the sloping surface, with the result that they protrude out of the first plug part (see FIG. 2). In order to enable a linear movement of the mandrel 16, the mandrel 16 has a thread on the rear side, in which thread a threaded bolt 17 has been inserted rotatably. By virtue of the rotation of the threaded bolt 17, the mandrel 16 is movable linearly in and counter to the plugging direction of the first locking means 10.

Figure 2:
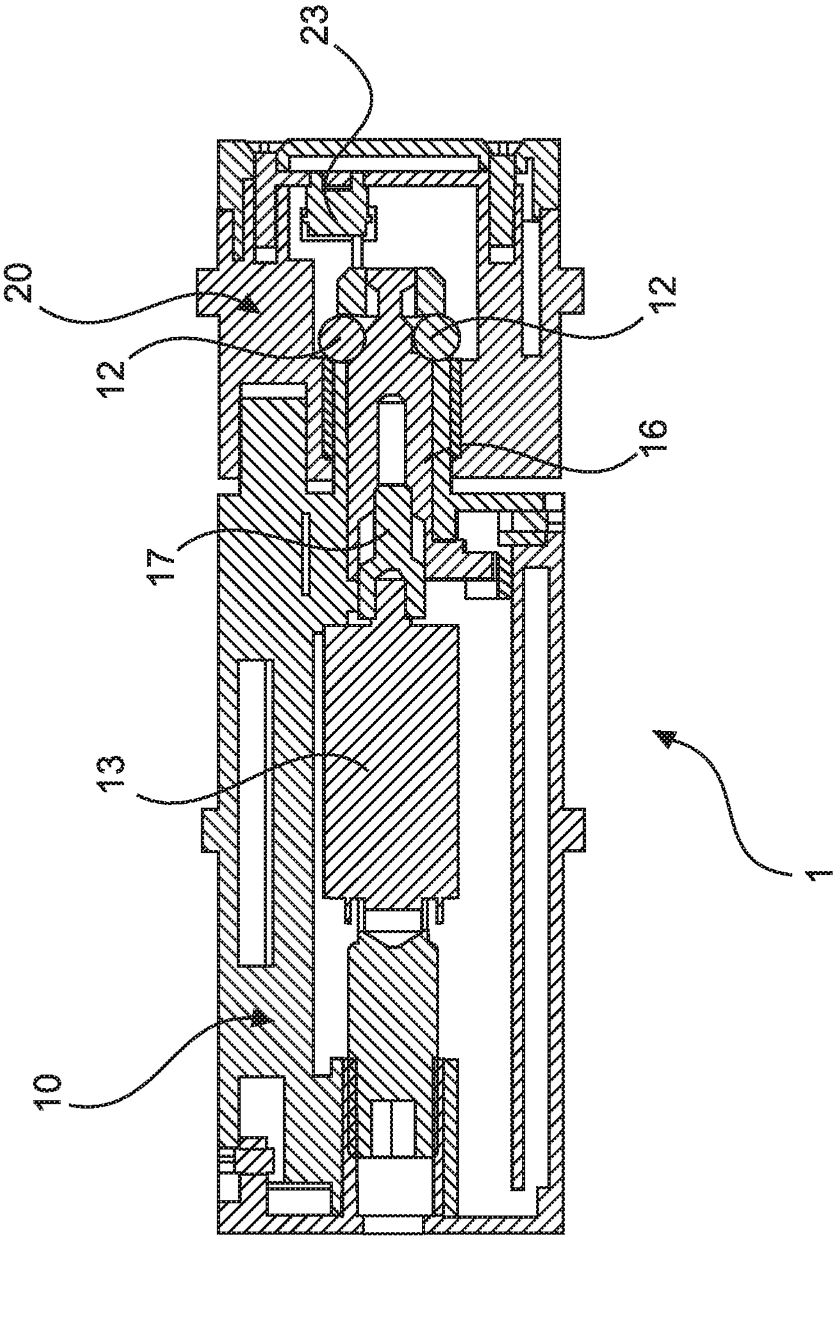
FIG. 2 shows a sectional illustration of a first embodiment of a locking device when connected.

An actuator 13, which may be in the form of a linear solenoid, a pneumatically operated actuator, or an electric motor is provided in the first locking means 10 for the rotation of the threaded bolt 17. As illustrated in FIGS. 1 and 2 the actuator 13 is in the form of an electric motor. By application of a voltage, the electric motor, as actuator 13, rotates the threaded bolt 17, as a result of which a linear movement of the mandrel 16 takes place. Thus, the blocking elements 12 can be moved out of the first plug part 11 or into the first plug part 11 by means of the actuator 13.

Furthermore, an indicator 9 is provided on the mandrel 16. The indicator 9 can be registered via a sensor 8 in the first locking means 10 and thus the position of the mandrel 16 can be determined. The sensor technology in the described exemplary embodiment may be optical, for example. However, other sensors with a magnetic or capacitive mode of operation, for example, are also conceivable.

An opening 18 is provided on the rear side in the first locking means 10, said opening enabling access to an activator 15. The activator 15 is embodied as a threaded bolt and is for the linear alignment and fixing of the actuator 13 in the first locking means 10. The actuator 13 and the activator 15 have a rotatable connection for this purpose. In the event of a power failure, the electrical power supply to the actuator 13, i.e. the electric motor, may no longer be ensured. In this case, the activator 15 can be rotated via the opening 18 and thus the entire actuator 13 can be moved linearly. As a result, the mandrel 16 is also moved counter to the plugging direction, as a result of which the balls 12 can penetrate the first plug part 11. Thus, even in the event of a lack of power supply, it is possible for the locking means 10, 20 to be released.

In addition to the first plug part 11, electrical contact elements 14 are also provided on the first locking means 10, on the plugging side. The contact elements 14 are only illustrated schematically in the drawings and can perform various tasks. For example, a limit switch 23 in the second locking means 20 can be connected to electronics or to the actuator 13 in the first locking means 10 via the contact elements 14.

The second locking means 20 has a second plug part 21, facing the first locking means 10, on the plugging side. The second plug part 21 is in the form of a socket, which acts in a corresponding manner to the first plug part 11, in the form of a pin, of the first locking means 10. The first plug part 11 can be received in a form-fitting manner in the second plug part 21. In this case, the second plug part 21 is shorter than the first plug part 11. Thus, the first plug part 11 can be inserted so far into the second plug part 21 that the blocking elements 12 reach as far as behind the second plug part 21 (see FIG. 2).

Contact elements 24 are provided on the second locking means 20 above the second plug part 21. The contact elements 24 which may be in the form of electrical contacts, pneumatic contacts or combined electrical and pneumatic contacts are for plugging and making contact with the corresponding contact elements 14 on the first locking means 10. The contact elements 24 are connected to the limit switch 23, which is arranged in the second locking means 20. The limit switch 23 is positioned in such a way that the first plug part 11 of the first locking means 10 can activate the limit switch 23 when said first plug part has been inserted completely into the second plug part 21.

The actuation of the actuator 13 can be enabled by means of the limit switch 23. Thus, the actuator 13 can only be operated when the limit switch 23 has been activated, i.e. only when the first locking means 10 and the second locking means 20 are connected completely. This prevents undesired locking of the quick release ball lock pin in the unplugged state or during the contact-making process of the locking device 1.

Expediently, the second plug part 21 is provided with a metal sleeve on the inside. This is primarily provided for protecting the plastic material. As a result, the plastic is not damaged during a plugging or separation process. Likewise, the blocking elements 12 can latch at the end of the metal sleeve in a better and more defined manner. Thus, a firm and precise fit between the first locking means 10 and the second locking means 20 is ensured.

FIG. 2 illustrates the locking device 1 from FIG. 1 in the locked state in which contact has been made. The first locking means 10 has been assembled with the second locking means 20, as a result of which the first plug part 11 has been completely inserted into the second plug part 21.

The motor acting as actuator 13 has been rotated to such an extent that the mandrel 16 has been pushed in the direction of the second locking means 20 via the threaded bolt 17, which is fastened on the rotor of the motor. By virtue of the linear displacement of the mandrel 16 within the first plug part 11, the blocking elements 12 have been pushed radially outwards over the sloping surface between the narrow and the broad region of the mandrel 16. The blocking elements 12 therefore protrude beyond the circumference of the first plug part 11 and jam behind the second plug part 21. As a result, withdrawal of the first plug part 11 out of the second plug part 21 is no longer possible.

Only by virtue of a rotation of the motor into the original position (FIG. 1) can the mandrel 16 be drawn back and thus the blocking elements 12 moved back into the first plug part 11. A particularly advantageous feature of the embodiment of the locking device 1 in the form of a quick release ball lock pin is that the release of the lock operates without any faults even when there is stress between the first locking means 10 and the second locking means 20. In this case, the advantages of a quick release ball lock pin are utilized such that the balls (blocking elements 12) are still movable into the first plug part 11 even under the influence of force. In the locked state, they are only supported by the mandrel 16 in order to maintain the locking action.

In the event of an insufficient, faulty or interrupted power supply to the actuator 13, emergency unlocking of the locking device 1 continues to be possible by means of the activator 15. By virtue of the activator 15 in the form of a screw bolt 30 being unscrewed, the actuator 13 fitted thereon is likewise moved counter to the plugging direction of the first locking means 10. Owing to the movement of the entire actuator 13, the mandrel 16 connected thereto is also moved in the first part 11 in such a way that the blocking elements 12 release the lock between the first locking means 10 and the second locking means 20.

Figure 3:
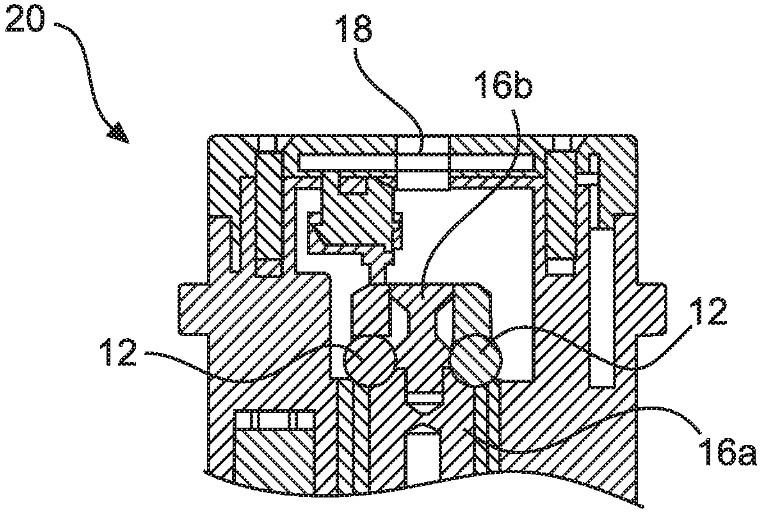
FIG. 3 shows a detailed view of a second embodiment of a locking device when connected.
Figure 4:
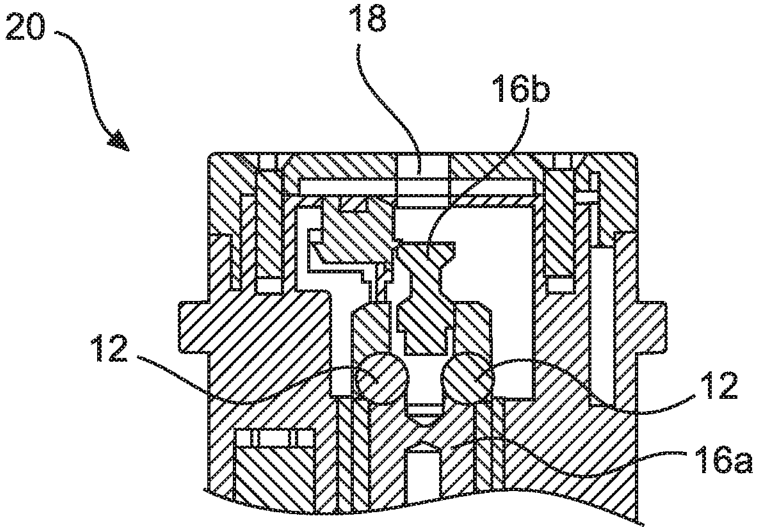
FIG. 4 is a view similar to FIG. 3 of a locking device when unconnected.

However, the described emergency unlocking only operates on the actuator side on the locking device 1. For emergency unlocking from the opposite side, a further embodiment is required, and this is shown in FIGS. 3 and 4. In this exemplary embodiment, the emergency unlocking can be actuated from the side of the second locking means 20, which does not include an actuator 13. For this purpose, the second locking means 20 has an opening 18, which enables access on the rear side to the inside of the second locking means 20.

In this exemplary embodiment, the mandrel 16 is formed in two parts. Specifically, the mandrel 16 is formed from a main part 16*a* and a tip 16*b*. The tip 16*b* of the mandrel 16 forms at least the broader region, which is provided for blocking of the blocking elements 12. In the exemplary embodiment shown, both the broader and the narrower region of the mandrel 16 are provided on the tip 16*b*.

The main part 16*a* and the tip 16*b* of the mandrel 16 are connected releasably to one another via a thread. In the event of emergency unlocking (FIG. 4), the tip 16*b* of the mandrel 16 can be unscrewed using a corresponding tool through the opening 18. By removal of the tip 16*b*, the blocking elements 12 can penetrate completely into the first plug part 11. The lock between the first locking means 10 and the second locking means 20 is thus released and separation of the plug connectors is possible. In this exemplary embodiment, the tip 16*b* of the mandrel 16 acts as activator 15 for opening the locking device 1.

This embodiment of the mandrel 16 enables particularly advantageous opening of the locking device 1 even when there is no power available for operating the actuator 13. Thus, faulty operation and technical failures of the actuator 13 can also be eliminated.

The invention claimed is:

1. A locking arrangement for plug connectors, having a first locking device and a second locking device, wherein the first locking device has at least one blocking element, wherein the first locking device and the second locking device are capable of being locked to one another by the blocking element, wherein the first locking device has an electrically operated actuator adapted to act on the blocking element to unlock the blocking element, wherein the activator is in the form of an electrically actuated screw bolt, which is arranged in the first locking device in rotatable and linearly movable fashion, wherein the actuator is fitted on the activator and is arranged so as to be linearly movable therewith, wherein the locking arrangement has a limit switch adapted to be switched when the first and second locking devices are completely in contact with one another, wherein the limit switch is electrically connected to the actuator via the contact elements, and wherein the locking device has an opening configured for providing access to the actuator so that the actuator may be manually moved in the event electrical power supply to the actuator is interrupted.

2. The locking arrangement as claimed in claim 1, wherein the actuator is in the form of an electric motor.

3. The locking arrangement as claimed in claim 1, wherein the actuator is in the form of a linear solenoid.

4. The locking arrangement as claimed in claim 1, wherein the actuator is a pneumatically operated actuator.

5. The locking arrangement as claimed in claim 1, wherein the first locking device and the second locking device have corresponding contact elements.

6. The locking arrangement as claimed in claim 5, wherein the contact elements are in the form of electrical contacts, pneumatic contacts or combined electrical and pneumatic contacts.

7. The locking arrangement as claimed in claim 1, wherein the limit switch is arranged in the second locking device and is adapted to be activated by the first locking device.

8. The locking arrangement as claimed in claim 7, wherein the limit switch is electrically connected to the actuator via the contact elements.

9. The locking arrangement as claimed in claim 1, wherein the activator is adapted to act on the actuator and the blocking element is thus adapted to be unlocked indirectly.

10. The locking arrangement as claimed in claim 9, wherein the activator is arranged in the first plug part and is accessible from the plugging direction of the first locking device.

11. The locking arrangement as claimed in claim 1, wherein the first locking device and the second locking device are each a plug connector module adapted to be received in a modular plug connector.

12. The locking arrangement as claimed in claim 11, wherein the first locking device and the second locking device have receivers, which are adapted to receive the locking device in a plug connector.

13. The locking arrangement as claimed in claim 1, wherein the first locking device has a first plug part, and the second locking device has a second plug part, wherein the first plug part and the second plug part are pluggable one inside the other.

14. The locking arrangement as claimed in claim 13, wherein the first plug part and the second plug part are pluggable one inside the other in a form-fitting manner.

15. The locking arrangement as claimed in claim 13, wherein the first plug part is in a form of a pin and the second plug part is in a form of a socket, or vice versa.

16. The locking arrangement as claimed in claim 13, wherein the blocking element is formed on the first plug part of the first locking device.

17. The locking arrangement as claimed in claim 16, wherein the blocking element is adapted to engage in the second plug part of the second locking device.

18. The locking arrangement as claimed in claim 13, wherein the first plug part of the first locking device is designed, together with the blocking element, as a so-called quick release ball lock pin, wherein the blocking element is in a form of a ball, and in that the second plug part of the second locking device is in a form of a receptacle for the quick release ball lock pin.

19. The locking arrangement as claimed in claim 18, wherein the quick release ball lock pin has two blocking elements in the form of balls.

* * * * *